(12) United States Patent
Resman

(10) Patent No.: US 6,480,305 B1
(45) Date of Patent: Nov. 12, 2002

(54) IMAGING DEVICE

(75) Inventor: Mark F. Resman, Boise, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/318,596

(22) Filed: May 25, 1999

(51) Int. Cl.[7] .............................................. H04N 1/04
(52) U.S. Cl. ...................................... 358/482; 358/475
(58) Field of Search ................................. 358/482, 483, 358/475, 512, 514, 509; 250/208.1, 227.2; 382/312

(56) References Cited

U.S. PATENT DOCUMENTS

| | | | |
|---|---|---|---|
| 4,778,989 A | 10/1988 | Hagemayer et al. | |
| 5,313,055 A | * 5/1994 | Shiratsuki et al. | ........ 250/208.1 |
| 5,424,855 A | * 6/1995 | Nakamura et al. | ........... 358/472 |
| 5,446,564 A | 8/1995 | Mawatari et al. | ............. 359/72 |
| 5,627,364 A | * 5/1997 | Codama | ................... 250/208.1 |
| 5,748,164 A | 5/1998 | Handschy et al. | ............. 345/89 |
| 5,748,232 A | 5/1998 | Konuma | ...................... 348/219 |
| 5,828,091 A | 10/1998 | Kawai | .......................... 257/218 |

OTHER PUBLICATIONS

European Search Report, Hewlett–Packard Company, Application No. GB 0012218.4, Dec. 7, 2000.

* cited by examiner

*Primary Examiner*—Cheukfan Lee
(74) *Attorney, Agent, or Firm*—Gregg W. Wisdom

(57) ABSTRACT

An imaging device includes plurality of illumination elements interspersed among a plurality of light sensing elements so that each illumination element is adjacent to a light sensing element. The illumination elements each include a ferroelectric liquid crystal element positioned over a LED. The light sensing elements each include a photodiode. The illumination elements and the light sensing elements are arranged so that adjacent to each illumination element is a light sensing element. Illumination control logic can selectively illuminate each of the illumination elements. The light sensing elements are coupled to analog shift registers. The light sensing elements generate charges related to the intensity of the impinging light. Sensor control logic is used to load the charges generated by the light sensing elements corresponding to the illuminated illumination elements into the shift registers. The charge data in the shift registers is sequentially shifted to the input of an amplifier. The amplifier generates a voltage proportional to the value of the charge data.

20 Claims, 3 Drawing Sheets

IMAGING DEVICE

FIELD OF THE INVENTION

This invention relates to scanning images. More particularly, this invention relates to an apparatus and a method for scanning images.

BACKGROUND OF THE INVENTION

Devices that scan images typically use mechanical hardware to move an image sensor relative to the object to be scanned. One way in which this is accomplished includes locating the image sensor on an assembly that moves the image sensor relative to the stationary object to be scanned. Another way in which this is accomplished is by moving the object to be scanned relative to a stationary image sensor. The image sensor generally samples reflected light from a relatively small fraction of the surface of the object to be scanned. The inclusion of the mechanical hardware necessary for relative movement between the image sensor and the object to be scanned increases the cost and reduces the reliability of the device. A need exists for a device to scan images having reduced mechanical complexity.

SUMMARY OF THE INVENTION

Accordingly, a scanning device for forming an electronic representation of an image on an object includes an imaging device. The imaging device includes a plurality of illumination elements and a plurality of light sensing elements, with the plurality of illumination elements interspersed among the plurality of light sensing elements. The imaging device includes a configuration to receive a signal to selectively illuminate the illumination elements and to selectively output data from the light sensing elements. The scanning device further includes a scanning mechanism coupled to the imaging device. The scanning mechanism includes a configuration to generate the signal and includes an arrangement to receive the data.

An imaging device includes a plurality of illumination elements and a plurality of light sensing elements, with the plurality of illumination elements interspersed among the plurality of light sensing elements. A method for forming an electronic representation of an image on an object using the imaging device includes selectively illuminating at least one of the illumination elements to illuminate the object. The method also includes reflecting light from the objecting onto at least one of the light sensing elements. The method further includes generating data from each of the light sensing elements receiving the light, with the data related to the light received by the light sensing elements. Additionally, the method includes outputting the data from the light sensing elements receiving the light.

An imaging device for generating data representing an image on an object includes a plurality of illumination elements for selectively illuminating the object. The imaging device also includes a plurality of light sensing elements, with the plurality of illumination elements interspersed among the plurality of light sensing elements. The illumination elements include a configuration for receiving light reflected from the object and generating data based upon the light.

DESCRIPTION OF THE DRAWINGS

A more thorough understanding of embodiments of the invention may be had from the consideration of the following detailed description taken in conjunction with the accompanying drawings in which.

DETAILED DESCRIPTION OF THE DRAWINGS

The present invention is not limited to the specific exemplary embodiments disclosed in this specification. Although the imaging device will be discussed in the context of a scanner, one of ordinary skill in the art will recognize that the imaging device can be used in a variety of systems that generate electronic representations of images such as hand held scanning devices.

Figure 1:
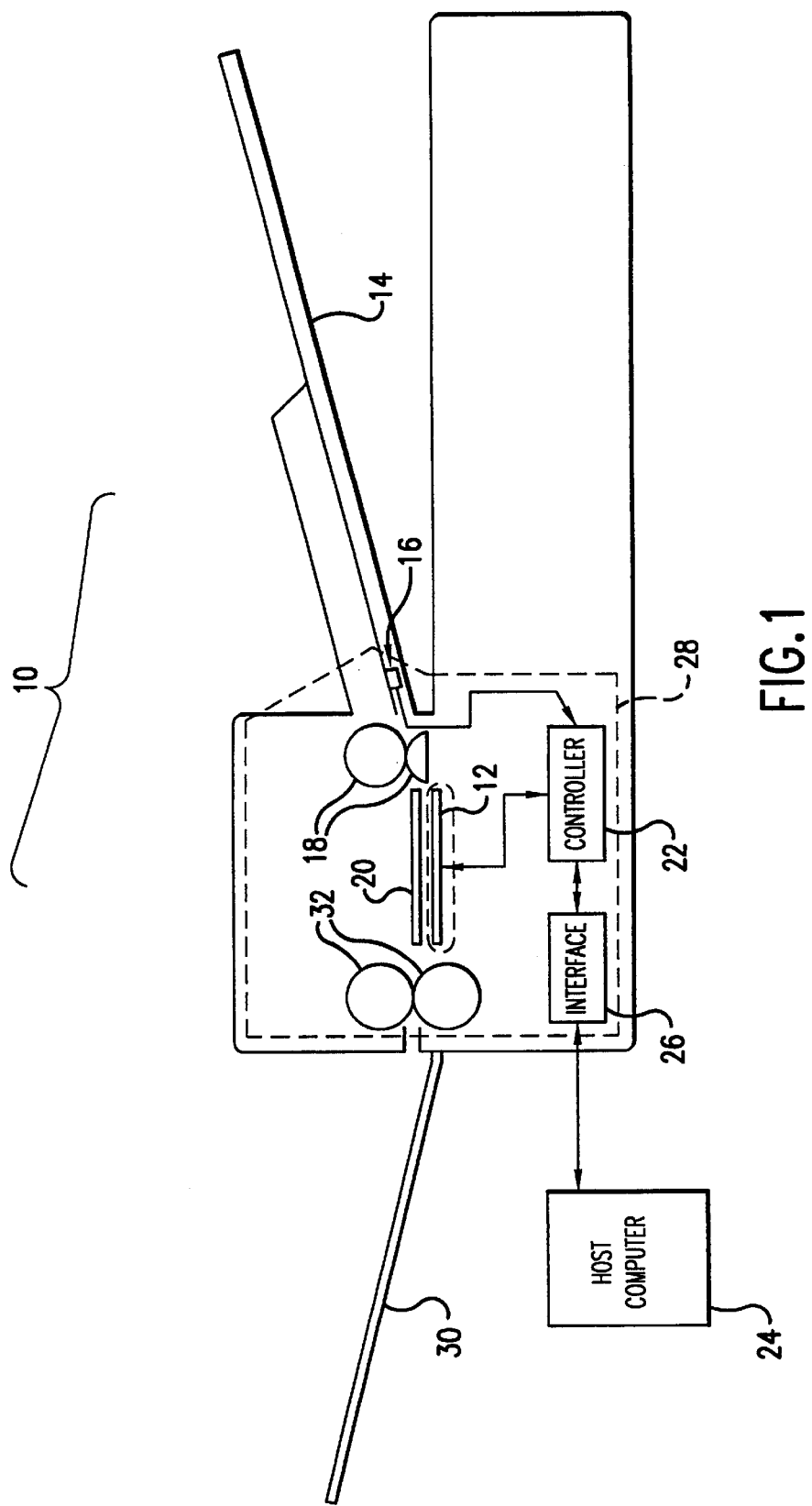
FIG. 1 depicts a simplified cross section of a scanner including an embodiment of the imaging device.

Shown in FIG. 1 is a simplified schematic view of an embodiment of a scanning device, such as scanner 10, including an embodiment of the imaging device, imaging device 12. The object to be scanned follows a straight through path in scanner 10. The object to be scanned, such as a unit of printed media, is placed in input device 14. Input device 14 could include an automatic document feeder for automatically loading units of printed media or a media tray. Sensor 16 detects the presence of the printed media loaded in input device 14. In response to the detection of printed media, pick rollers 18 pull the printed media onto the transparent surface 20. Imaging device 12 is positioned below the transparent surface 20. Transparent surface 20 provides support for the printed media. Alternatively, the surface on top of imaging device 12 could be used to directly support the printed media. Imaging device 12 includes the capability to illuminate the printed media on transparent surface 20 and to detect the light reflected from the surface of the printed media. Imaging device 12 generates data representing the image on the surface of the printed media. Controller 22 is coupled to imaging device 12. Controller 22 generates a signal to control the illumination of the printed media by imaging device 12 and receives data generated by imaging device 12. The signal generated by controller 22 could included, for example, digital control data that could be sent to imaging device 12. Controller 22 processes the data received from imaging device 12 to assemble it into a format useable by host computer 24. After controller 22 completes the processing on the data received from imaging device 12, controller 22 can send the formatted data through interface 26 to host computer 24. Host computer 24 could display the formatted data representing the image on the surface of printed media, store the formatted image data, print the image, perform image processing operations on the formatted data, or perform a combination of these functions. Alternatively, controller 22 could perform the image processing on the data received from imaging device 12 and send the formatted data to host computer 24 ready for printing or display.

At a block diagram level, scanner 10 includes an embodiment of a scanning mechanism, such as scanning mechanism 28, coupled to imaging device 12. Scanning mechanism 28 includes the hardware necessary to position the printed media for imaging device 12 to generate the data, to move the printed media into output device 30 and to deliver processed data to host computer 24. This hardware could include, for example, pickup rollers 18, output rollers 32, transparent surface 20, controller 22, and interface 26. Scanning mechanism 28 is coupled to imaging device 12.

Scanning mechanism 28 can control imaging device 12 to generate data representing the image of the printed media over the entire area of transparent surface 20 or over a portion of the area of transparent surface 20.

A reduced hardware alternative embodiment of the scanning device would not use pick rollers 18, output rollers 32, input device 14, or output device 30. This alternative embodiment of the scanning device would include the hardware necessary to send the data processed by a controller through an interface to a printer or through a modem to a remotely located host. In the alternative embodiment of the scanning device, the user would manually place the object to be scanned, such as printed media, in position for the imaging device to generate data representing the image on the surface of the printed media.

Figure 2:
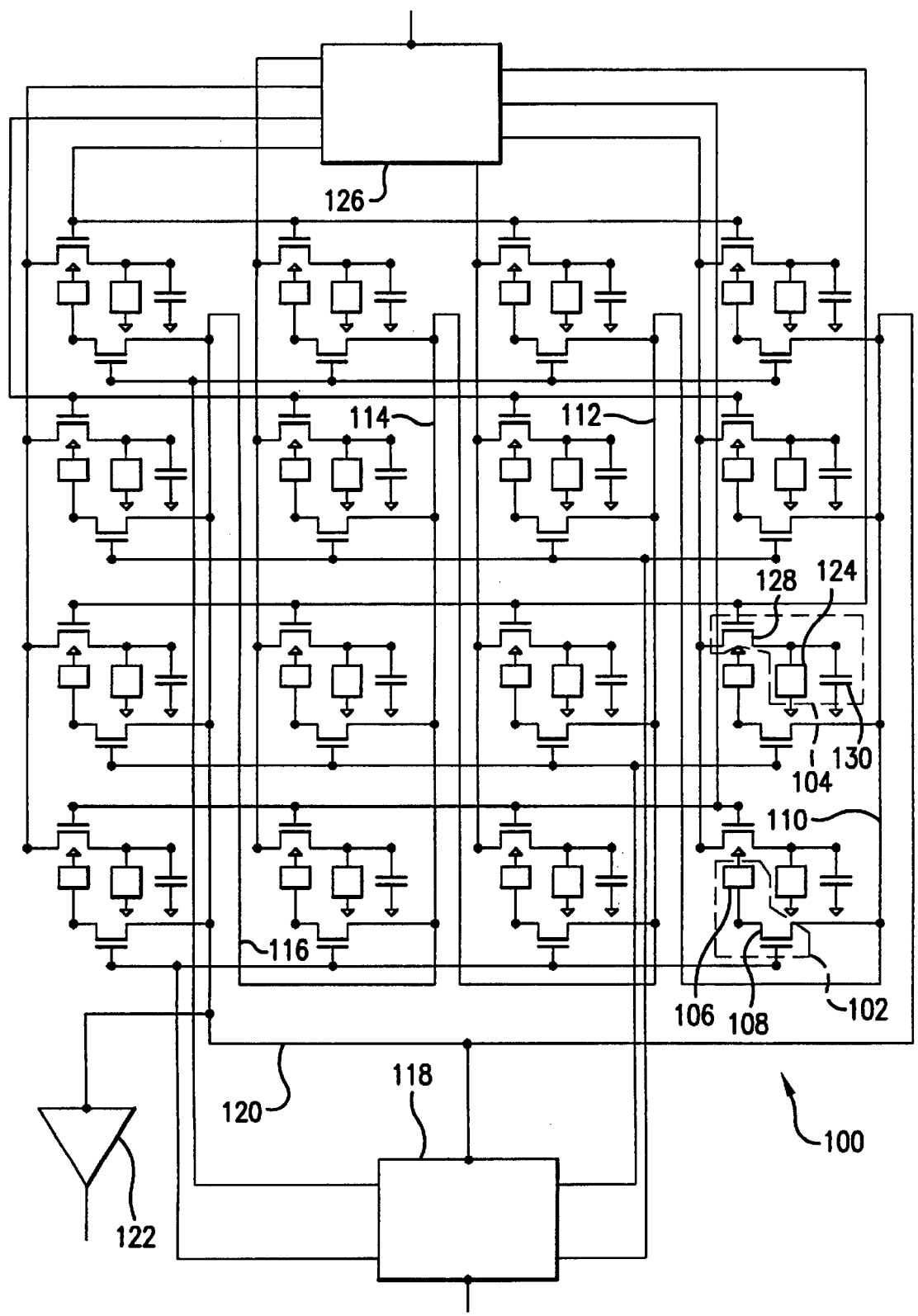
FIG. 2 depicts a schematic representation of part of an embodiment of the imaging device.

Shown in FIG. 2 is an embodiment of the imaging device, imaging device 100. For simplicity of illustration, imaging device 100 includes a relatively small number of light sensing elements and illumination elements. It should be recognized that the principles illustrated in imaging device 100 could be applied in an imaging device having an arbitrarily large number of light sensing elements and illumination elements. Additionally, these principles could be applied in an imaging device having fewer light sensing elements and illumination elements than shown in FIG. 2.

Imaging device 100 shown in FIG. 2 includes an array of 16 light sensing elements and 16 associated illumination elements. In imaging device 100 the illumination elements are interspersed among the light sensing elements so that each illumination element is adjacent to a light sensing element and the number of illumination elements equals the number of light sensing elements. However, it should be recognized that each light sensing element need not be located adjacent to an illumination element and the number of illumination elements need not equal the number of light sensing elements. The illumination elements may be interspersed among the light sensing elements in a variety of ways. For example, if the illumination elements emit light of sufficient intensity, the illumination elements may be interspersed among the light sensing elements so that there is only a single illumination element for each group of three light sensing elements. For this embodiment of the imaging device, the illumination elements may be interspersed among the light sensing elements in clusters with one illumination element grouped with three light sensing elements. Alternatively, the illumination elements may be interspersed among the light sensing elements so that every three rows of light sensing elements are separated by one row of illumination elements. The optimal ratio of the number of light sensing elements to the number of illumination elements depends upon the sizes of the light sensing elements and the intensity of the light emitted by the illumination elements.

The light sensing elements could include such semiconductor devices as photodiodes, phototransistors, or it could include light sensing elements having a resistance that varies with light radiation, or the like. The illumination elements could include such devices as solid state lamps, incandescent lamps, or ferroelectric liquid crystal elements positioned over solid state lamps. An exemplary light sensing element included in imaging device 100 is light sensing element 102. An exemplary illumination element included in imaging device 100 is illumination element 104.

In imaging device 100, the exemplary light sensing element 102 includes photodiode 106 that is used to form a charge coupled device. Light impinging upon the surface of photodiode 106 generates charge carriers. Light sensing element 102 is electrically biased so that these charge carriers are separated and thereby generate a voltage across photodiode 106. The magnitude of the charge generated is related to the quantity of light energy impinging upon photodiode 106. In a similar fashion, the other light sensing elements generate charges related to the quantity of light impinging upon them. In scanner 10, the light impinging upon the photodiodes is reflected from the surface of the printed media.

First transistor 108, included in light sensing element 102, couples the charge generated by photodiode 106 to first register 110. First register 110 includes an analog shift register. First register 110 stores the charge generated on photodiode 106. Second register 112, third register 114, and fourth register 116 perform a function similar to first register 110. The shift registers store the charges loaded from the photodiodes as charge data. Analog shift registers can load charges into storage cells and then can shift the charge data from cell to cell. A light sensing element controller, such as sensor control logic 118, provides the signals applied to the gates of the MOSFET transistors coupled between the shift registers and the photodiodes. Sensor control logic 118 applies the drive signals to the gates of the MOSFET transistors coupled to the photodiodes to transfer the charges generated by the photodiodes to the corresponding shift registers. Sensor control logic 118 also controls the movement of the charge data through first register 110, second register 112, third register 114, fourth register 116, and fifth register 120. Sensor control logic 118 is configured to control the shifting of the charge data through first register 110, second register 112, third register 114, and fourth register 116 into fifth register 120.

The charge data that enters fifth register 120 is sequentially shifted to the input of amplifier 122. Amplifier 122 sequentially generates voltages proportional to the charge data shifted to its input by fifth register 120. An analog to digital convertor (not shown in FIG. 2) generates a digital representation of the voltages at the output of amplifier 122. The series of digital values represents the intensity of the light impinging upon each of the photodiodes in imaging device 100. Where the light impinging upon the photodiodes is reflected from the surface of printed media containing an image, this series of digital values forms a digital representation of the image. By using sensor control logic 118 to shift the charge data in a known sequence from the shift registers, each of the digital values derived from the charge data can be mapped to the light sensing element that generated it. Therefore, the digital values along with the information linking the digital values to locations with the array of light sensing elements can be used to reconstruct the image on the printed media. If imaging device 100 were used in scanner 10, the analog to digital converter could be included within controller 22.

The illumination element 104 includes a ferroelectric liquid crystal (FLC) element 124. A solid state lamp, such as an LED, is positioned below the FLC element. The solid state lamps may either have power applied continuously, or, if a power savings is desired, power may be supplied when illumination is required. An illumination element controller, such as Illumination control logic 126, provides the control signals needed to control the FLC elements. Second transistor 128 is coupled to the control signals supplied by illumination control logic 126. The control signals supplied by illumination control logic 126 are configured so that each illumination element can be individually addressed.

Where the solid state lamps beneath the liquid crystal are continuously powered, the control signals supplied by illumination control logic 126 provide a voltage across FLC element 124. With a voltage applied across the FLC element 124, the liquid crystal blocks the light supplied by the solid state lamp beneath it. Without a voltage applied to the liquid crystal, the light generated by the solid state lamp beneath propagates through the liquid crystal and illuminates the object to be scanned. Capacitor 130 coupled across FLC element 124 stores charge supplied by the control signal from illumination control logic 126. Capacitor 130 permits the application of a voltage across the liquid crystal when the control signal from illumination control logic 126 is not present. To permit light to pass through the FLC element 124, second transistor 128 would be turned on while a low level control signal is applied by illumination control logic 126, thereby discharging capacitor 130.

Imaging device 100 can be constructed to generate digital representations of images on printed media from monochrome illumination or from broad spectrum illumination. Where monochrome illumination is used, a single color of solid state lamp may be used to generate the light. Additionally, a light sensing element having greatest sensitivity in the frequency range corresponding to the color of the solid state lamp would be used. Alternatively, an illumination element emitting a broad spectrum of light may be used, provided the light sensing element has sufficient sensitivity over some frequency range within that spectrum.

Where broad spectrum illumination is used, the illumination element could use a broad band light source such as an incandescent lamp or a "white light" solid state lamp (a type of solid state lamp that can generate light having a substantially uniform energy spectrum over the visible range of light), or arrays of red, green, and blue solid state lamps to generate light having a substantially uniform energy spectrum over the visible range of light. To generate digital representations of the images on printed media that contain color information, the light sensing element could include the capability to detect the component colors of the light impinging upon the light sensing element. For example, if the array of light sensing elements were constructed so that approximately one third of the light sensing elements were tuned to detect red light, one third green light, and one third blue light, then the data generated would include color information about the image on the printed media. Alternatively, light sensing elements each having a relatively broad band response could be used with red, green, and blue filters to generate color information. Either of these implementations would work optimally if the light sensing elements tuned to detect the different frequency ranges of light were distributed over the area of the imaging device.

An alternative implementation of the light sensing elements to gather color information would involve using separate sections in each light sensing element. Each of the sections in the light sensing element would have its greatest spectral sensitivity at one of component colors. For a light sensing element using three sections with each of the sections optimized to measure one of the component colors, such as red, green, and blue, the outputs of each of the three sections would be related to the light energy impinging upon the sensor section in the spectral range corresponding to the section. The light sensing elements could, for example, include photodiodes responsive to a broad band of visible light frequencies and light filters designed to pass a narrow band around the component colors. Alternatively, the light sensing elements could include photodiodes that are sensitive to a relatively narrow band of frequencies around the component colors. For light sensing elements implemented in either of these ways, the corresponding illumination elements could be optimally implemented using a broad band light source such as a white light solid state lamp.

Another alternative implementation of the light sensing elements could use light sensing elements having a broad range of sensitivity and illumination elements that each generate one of the component colors. The illumination elements corresponding to each of the component colors would be sequentially illuminated as a group. The light sensing elements would sequentially measure the reflected light from the printed media corresponding to each of the component colors to obtain the color information for the image on the printed media. This alternative implementation would have the advantage of having a reduced number of light sensing elements but would require more time to collect the color information for each of the component colors.

The imaging device has several performance features that make it well suited for forming electronic representations of images on printed media. Embodiments of the imaging device include an array of light sensing elements interleaved with an array of illumination elements. If the embodiments of the imaging device have a sufficiently large area, an electronic representation of the entire image can be generated without requiring relative movement between the printed media and the imaging device during the imaging operation. This feature allows rapid generation of an electronic representation of the image on the surface of the printed media. Additionally, because relative movement during the imaging operation is not required, the mechanical hardware required for this embodiment is relatively simple. Another beneficial feature of the embodiments of the imaging device is the capability to selectively form an electronic representation of part of the image on the surface of the printed media. Because the light sensing elements and the illumination elements are addressable, forming an electronic representation of the image on any part of the printed media is as easily done as on any other part.

Figure 3:
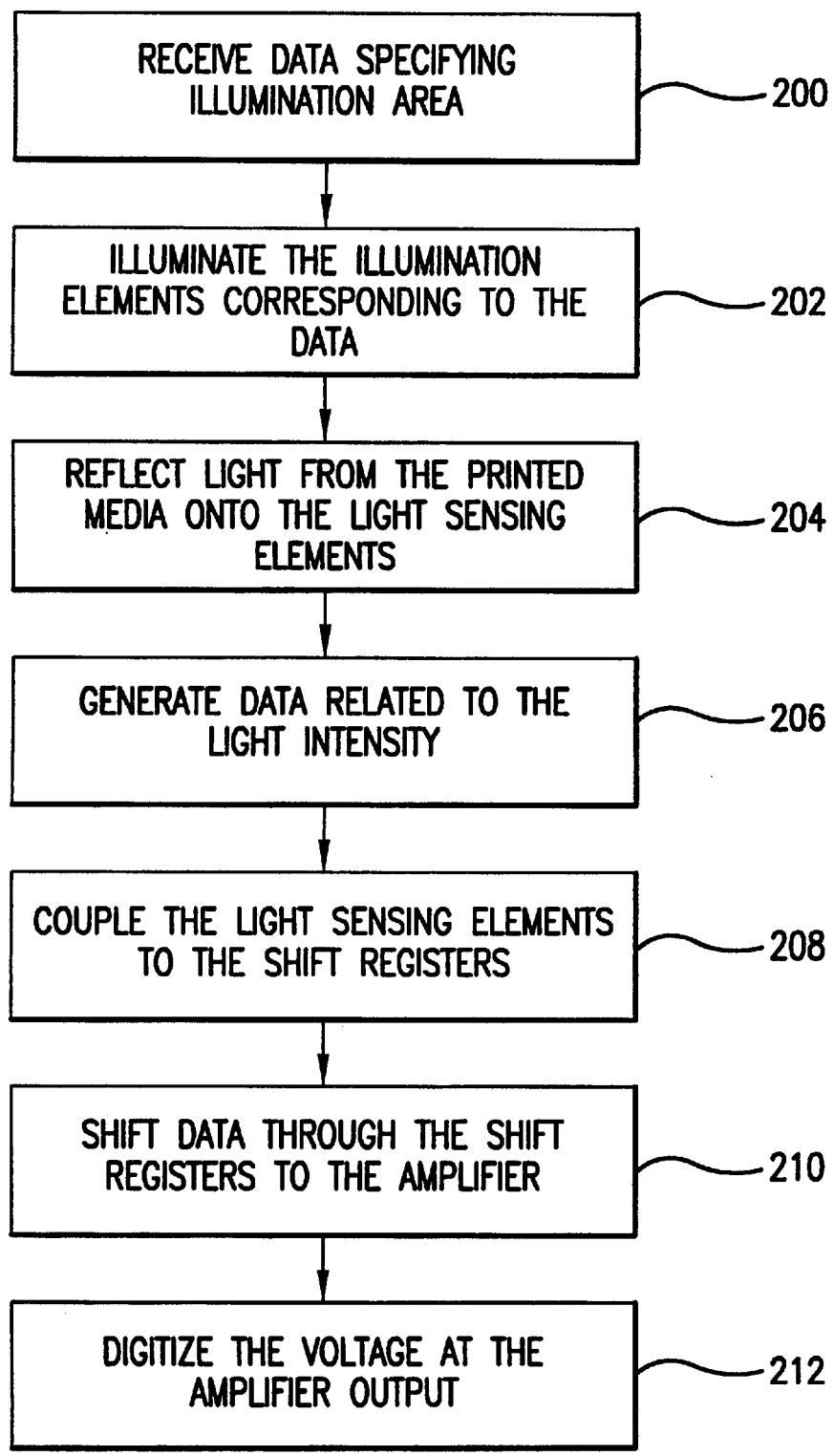
FIG. 3 shows a high level flow diagram of a method for using the imaging device.

Shown in FIG. 3 is a high level flow diagram of a method for using the type of embodiment of the imaging device shown in FIG. 2 to form an electronic representation of an image on the surface of printed media. First, in step 200, a signal, including data specifying the area of the printed media for which an electronic representation is to be formed, is received by illumination control logic 126. Next, in step 202, illumination control logic 126 illuminates the illumination elements corresponding to the data specifying the area of the printed media for which an electronic representation is to be formed. Then, in step 204, light is reflected from printed media onto the light sensing elements. Next, in step 206, data, such as the charges resulting from light impinging upon photodiodes, is generated in each of light sensing elements illuminated. The data relates to the light received by each of the light sensing elements. Then, in step 208, sensor control logic 118 provides the necessary signals to couple the light sensing elements corresponding to the illuminated illumination elements to the corresponding shift registers. Next, in step 210, sensor control logic 118 sequentially shifts the data through the shift registers to amplifier 122. Finally, in step 212, the voltage at the output of amplifier 122 is digitized to form digital data representing the image on the printed media.

Although several embodiments of the invention have been illustrated, and their forms described, it is readily apparent to those of ordinary skill in the art that various modifications may be made to these embodiments without departing from the spirit of the invention or from the scope of the appended claims.

What is claimed is:

1. A scanning device for forming an electronic representation of an image on an object, comprising:
   an imaging device including a plurality of illumination elements and a plurality of light sensing elements, with the plurality of illumination elements interspersed among the plurality of light sensing elements and with the illumination elements and the light sensing elements existing substantially within a plane and with the imaging device configured to receive a signal to selectively illuminate the illumination elements and to selectively output data from the light sensing elements; and
   a scanning mechanism coupled to the imaging device, with the scanning mechanism configured to generate the signal and arranged to receive the data.

2. The scanning device as recited in claim 1, wherein:
   the plurality of illumination elements interspersed among the plurality of light sensing elements includes each of the illumination elements located adjacent to one of the light sensing elements.

3. The scanning device as recited in claim 2, wherein:
   the imaging device includes an illumination element controller arranged to receive the signal and configured to selectively illuminate the illumination elements based upon the signal.

4. The scanning device as recited in claim 3, wherein:
   the imaging device includes a light sensing element controller arranged to receive the signal and configured to selectively output the data from the light sensing elements based upon the signal.

5. The scanning device as recited in claim 4 wherein:
   the imaging device includes a plurality of shift registers coupled to the light sensing elements and the light sensing element controller with the shift registers arranged to receive the data from the light sensing elements.

6. The scanning device as recited in claim 5 wherein:
   the data includes charges generated by the light sensing elements.

7. The scanning device as recited in claim 6 wherein:
   the light sensing elements each include a photodiode; and
   the illumination elements each include a ferroelectric liquid crystal.

8. A method for forming an electronic representation of an image on an object using an imaging device including a plurality of illumination elements and a plurality of light sensing elements with the plurality of illumination elements interspersed among the plurality of light sensing elements and with the illumination elements and the light sensing elements existing substantially within a plane, comprising:
   selectively illuminating at least one of the illumination elements to illuminate the object;
   reflecting light from the object onto at least one of the light sensing elements; and
   generating data from each of the light sensing elements receiving the light, with the data related to the light received by the light sensing elements; and
   outputting the data from the light sensing elements receiving the light.

9. The method as recited in claim 8, further comprising:
   receiving a signal with the imaging device before selectively illuminating the illumination elements.

10. With the imaging device including an illumination element controller coupled to the illumination elements, the method as recited in claim 9, wherein:
    selectively illuminating the illumination elements includes selecting the illumination elements for illumination based upon the signal.

11. With the imaging device including a light sensing element controller, the method as recited in claim 10, wherein:
    outputting the data from the light sensing elements receiving the light includes selecting the light sensing elements for outputting of the data based upon the signal.

12. The method as recited in claim 11, wherein:
    generating data includes generating charges in the light sensing elements receiving the light.

13. The method as recited in claim 12, wherein:
    the light sensing elements each include a photodiode; and
    the illumination elements each include a ferroelectric liquid crystal.

14. An imaging device for generating data representing an image on an object, comprising:
    a plurality of illumination elements for selectively illuminating the object; and
    a plurality of light sensing elements, with the plurality of illumination elements interspersed among the plurality of light sensing elements so that the illumination elements and the light sensing elements exist substantially within a plane and with the illumination elements for receiving light reflected from the object and generating data based upon the light.

15. The imaging device as recited in claim 14, wherein:
    the plurality of illumination elements interspersed among the plurality of light sensing elements includes each of the illumination elements located adjacent to one of the light sensing elements.

16. The imaging device as recited in claim 15, further comprising:
    an illumination controller coupled to the illumination elements and arranged to receive a signal, with the illumination controller configured to selectively illuminate the illumination elements based upon the signal.

17. The imaging device as recited in claim 16, further comprising:
    a light sensing element controller arranged to receive the signal and configured to selectively output the data from the light sensing elements based upon the signal, with the light sensing element controller arranged to receive the data output from the light sensing elements selected by the light sensing element controller.

18. The imaging device as recited in claim 17, further comprising:
    a plurality of shift registers coupled to the light sensing elements and the light sensing element controller.

19. The imaging device as recited in claim 18, wherein:
    the data includes charges generated by the light sensing elements.

20. The imaging device as recited in claim 19, wherein:
    the light sensing elements each include a photodiode; and
    the illumination elements each include a ferroelectric liquid crystal.

* * * * *